(12) United States Patent
Richter et al.

(10) Patent No.: US 7,785,956 B2
(45) Date of Patent: Aug. 31, 2010

(54) TECHNIQUE FOR COMPENSATING FOR A DIFFERENCE IN DEPOSITION BEHAVIOR IN AN INTERLAYER DIELECTRIC MATERIAL

(75) Inventors: Ralf Richter, Dresden (DE); Robert Seidel, Dresden (DE); Carsten Peters, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/168,443

(22) Filed: Jul. 7, 2008

(65) Prior Publication Data

US 2009/0087999 A1    Apr. 2, 2009

(30) Foreign Application Priority Data

Sep. 29, 2007    (DE) .................... 10 2007 046 847

(51) Int. Cl.
*H01L 21/8238*    (2006.01)
(52) U.S. Cl. .................... 438/218; 438/14; 438/199; 257/369; 257/E21.529
(58) Field of Classification Search ............ 257/E21.24, 257/369–377, 204, E21.521–E21.531, E21.53, 257/E21.632–E21.643, E27.06, E27.062; 438/762, 13–18, 199–233, 787, 791
See application file for complete search history.

(56) References Cited

U.S. PATENT DOCUMENTS

| 5,814,377 | A | * | 9/1998 | Robles et al. ............... 427/579 |
| 7,009,226 | B1 |  | 3/2006 | Sun ........................... 257/192 |
| 2006/0091471 | A1 | * | 5/2006 | Frohberg et al. ............ 257/369 |
| 2007/0007552 | A1 |  | 1/2007 | Zhu et al. .................... 257/204 |
| 2007/0108525 | A1 |  | 5/2007 | Yang et al. .................. 257/351 |
| 2007/0200179 | A1 | * | 8/2007 | Chen .......................... 257/369 |
| 2008/0081480 | A1 | * | 4/2008 | Frohberg et al. ............ 438/703 |

OTHER PUBLICATIONS

Translation of Official Communication from German Patent Office for German Patent Application No. 10 2007 046 847.6 dated Jun. 16, 2008.

* cited by examiner

*Primary Examiner*—Matthew C Landau
*Assistant Examiner*—Aaron Staniszewski
(74) *Attorney, Agent, or Firm*—Williams, Morgan & Amerson, P.C.

(57) ABSTRACT

By selectively providing a buffer layer having an appropriate thickness, height differences occurring during the deposition of an SACVD silicon dioxide may be reduced during the formation of an interlayer dielectric stack of advanced semiconductor devices. The buffer material may be selectively provided after the deposition of contact etch stop layers of both types of internal stress or may be provided after the deposition of one type of dielectric material and may be used during the subsequent patterning of the other type of dielectric stop material as an efficient etch stop layer.

17 Claims, 5 Drawing Sheets

TECHNIQUE FOR COMPENSATING FOR A DIFFERENCE IN DEPOSITION BEHAVIOR IN AN INTERLAYER DIELECTRIC MATERIAL

BACKGROUND OF THE INVENTION

1. Field of the Invention

Generally, the present disclosure relates to the formation of integrated circuits, and, more particularly, to the formation of a dielectric interlayer including highly stressed materials to enhance performance of field effect transistors.

2. Description of the Related Art

During the fabrication of integrated circuits, a large number of circuit elements are formed on a given chip area according to a specified circuit layout. One important circuit element in modern semiconductor devices is the field effect transistor. Generally, a plurality of process technologies are currently practiced, wherein, for complex circuitry, such as microprocessors, storage chips and the like, MOS technology based on silicon is currently the most promising approach due to the superior characteristics in view of operating speed and/or power consumption and/or cost effectiveness. During the fabrication of complex integrated circuits using CMOS technology, millions of field effect transistors, i.e., N-channel transistors and P-channel transistors, are formed on a substrate including a crystalline semi-conductor layer, such as a silicon-based layer. A MOS transistor, irrespective of whether an N-channel transistor or a P-channel transistor is considered, comprises so-called PN junctions that are formed by an interface of highly doped drain and source regions with a lightly doped channel region disposed between the drain region and the source region. The conductivity of the channel region, i.e., the drive current capability of the conductive channel, is controlled by a gate electrode that comprises a line-like portion and is formed above the channel region and separated therefrom by a thin insulating layer.

Typically, the circuit elements, such as the MOS transistors, capacitors and the like, are formed in a common layer, which will be referred to hereinafter as a device layer, whereas the "wiring," i.e., the electrical connection of circuit elements according to the circuit design, may be accomplished only to a certain degree by means of conductive lines, such as polysilicon and the like, within the device layer so that one or more additional "wiring" layers formed over the device layer may be required. These wiring layers include metal lines embedded into an appropriate dielectric material, such as silicon dioxide, silicon nitride and the like, or, in advanced devices, low-k materials having a permittivity of 3.0 or less are used. The metal lines and the surrounding dielectric material will be referred to hereinafter as a metallization layer. Between two stacked adjacent metallization layers and also between the device layer and the first metallization layer, respective dielectric interlayers are formed through which metal-filled openings are formed to establish the electrical connection between metal lines of the adjacent metallization layers or between circuit elements and metal lines of the first metallization layer. In typical applications, the dielectric interlayer separating the device layer from the first metallization layer is essentially formed from silicon dioxide that is deposited above a dielectric etch stop layer by well-established plasma enhanced chemical vapor deposition (PECVD) techniques, which enable the formation of a smooth and dense silicon dioxide film with sufficient conformality at moderately high deposition rates.

Due to the continuous device scaling, resulting in gate length of MOS transistors on the order of magnitude of 50 nm and less, further performance enhancement of the individual transistors may be difficult to achieve, since a reduced gate length typically requires an adaptation of the silicon dioxide based gate insulation layer which controls the capacitive coupling between the gate electrode and the channel region. Since the thickness of the silicon dioxide based gate insulation layer has now reached 2 nm and less, a further reduction of the thickness thereof may be accompanied by significant performance degradation due to leakage currents, as the amount of leakage currents may exponentially depend on the thickness of the silicon dioxide based insulating layer. Thus, unless sophisticated high-k dielectric materials may be implemented in the overall CMOS process flow, further device scaling may be associated with a less pronounced performance gain due to the reduced controllability of the channel, if the gate oxide thickness is substantially maintained. Therefore, it has been proposed to further enhance the transistor performance by inducing an appropriate type of strain in the channel regions of the transistors in order to significantly modify the charge carrier mobility. For example, for a standard crystallographic orientation of a silicon-based semiconductor layer, that is, when the silicon represents a silicon material having a surface orientation (100) with the channel length oriented along a <110> direction, a compressive strain in the channel region may result in an improvement of the hole mobility, while a tensile strain may result in an increase of the electron mobility. The enhanced charge carrier mobility thus directly translates into enhanced transistor performance with respect to current drive capability and operating speed. Thus, a plurality of different mechanisms has been developed to obtain the desired type and magnitude of strain in the respective channel regions.

One efficient mechanism in generating strain in a transistor device is the deposition of highly stressed dielectric materials above the individual transistor elements, wherein the highly stressed dielectric material may then act on the transistor structure to provide the desired type of strain in the channel region. Since the contact etch stop layer is positioned close to the channel region and since silicon nitride, nitrogen-enriched silicon carbide and the like, which are frequently used materials for the contact etch stop layer, may be deposited with high internal stress levels, respective manufacturing schemes have been developed to position an appropriately stressed contact etch stop layer above the transistor element under consideration. That is, a contact etch stop material may be positioned above P-channel transistors with a high internal stress level, which may also be referred to as compressive stress, to induce a specific type of strain in order to enhance the hole mobility of P-channel transistors. For example, compressive stress levels of up to 3 GPa and higher may be achieved on the basis of PECVD techniques by appropriately controlling the deposition parameters. Similarly, the contact etch stop material above N-channel transistors may be provided with high internal tensile stress, thereby reaching values of up to 2 GPa and higher, which may result in an appropriate strain in the channel region for increasing the electron mobility. The deposition of the appropriately stressed etch material above P-channel transistors and N-channel transistors may be accomplished on the basis of well-established masking regimes. For instance, the compressively stressed dielectric material may be deposited first, and may then be selectively removed above the N-channel transistor, followed by the deposition of the tensilely stressed material which may then be selectively removed from above the P-channel transistor. Similarly, a process sequence may be used in which the tensilely stressed material is deposited first, then selectively removed from above the P-channel transistor, followed by a further deposition and selective patterning process for the material having the compressive stress. Depending on the process and device requirements, the patterning of the dielectric materials of different internal stress may be associated with the deposition of appropriate etch stop materials or etch indicator materials, for instance in the form of silicon dioxide and the like.

As previously discussed, highly advanced semiconductor devices having transistor elements with gate lengths of 50 nm and less may also include distances between neighboring circuit elements, such as gate electrodes, which may also be scaled down in correlation with the gate length, thereby obtaining values of 200 nm and significantly less, resulting in a space of 100 nm or less between densely packed gate electrode structures. Thus, although these techniques are highly desirable in view of the stress transfer mechanism provided by the highly stressed etch stop material, the gap fill capabilities of the high rate PECVD techniques for the deposition of the silicon nitride material may be taken into consideration, thereby imposing significant constraints on the overall process flow for forming the etch stop material and also for the interlayer dielectric material, which may typically be provided in the form of silicon dioxide. That is, an appropriate deposition technique has to be used to reliably form the interlayer dielectric material above the pronounced surface topography created by the subsequent complex deposition sequence for forming the highly stressed etch stop materials of different intrinsic stress.

For this reason, usually the interlayer dielectric material may be deposited, at least immediately above the highly stressed etch stop material, by a deposition technique having a significantly enhanced gap fill capability so as to avoid the creation of deposition irregularities, such as voids in the deposited material. The silicon dioxide-based material may therefore be formed by a thermal chemical vapor deposition (CVD) process on the basis of TEOS and ozone, which generates a silicon dioxide film exhibiting excellent gap fill capabilities, that is, this deposition technique provides even for a "flow-like" behavior, thereby allowing the reliable filling of empty spaces between closely spaced circuit elements, such as gate electrode structures. In view of the layer and deposition characteristics, the thermal CVD process is typically performed at significantly higher pressures compared to PECVD techniques, for example, in the range of 200-760 Torr, and this deposition process is therefore denoted as "sub-atmospheric CVD" (SACVD). However, the material and process characteristics of the SACVD oxide may differ significantly from PECVD oxide in terms of mechanical integrity and deposition rate. Consequently, in some process strategies, a PECVD oxide may be formed above the SACVD oxide to enhance the characteristics of the overall interlayer dielectric material and provide enhanced process reliability during a subsequent planarization process, for instance, on the basis of a chemical mechanical polishing (CMP) process. A substantially planar surface topography may represent an important aspect during the further processing of the semiconductor device, since the subsequent lithography process and the following contact etch process may be influenced by the surface topography as well as by the material composition of the complex interlayer dielectric stack, in particular if highly scaled semiconductor devices are considered.

Figure 1:
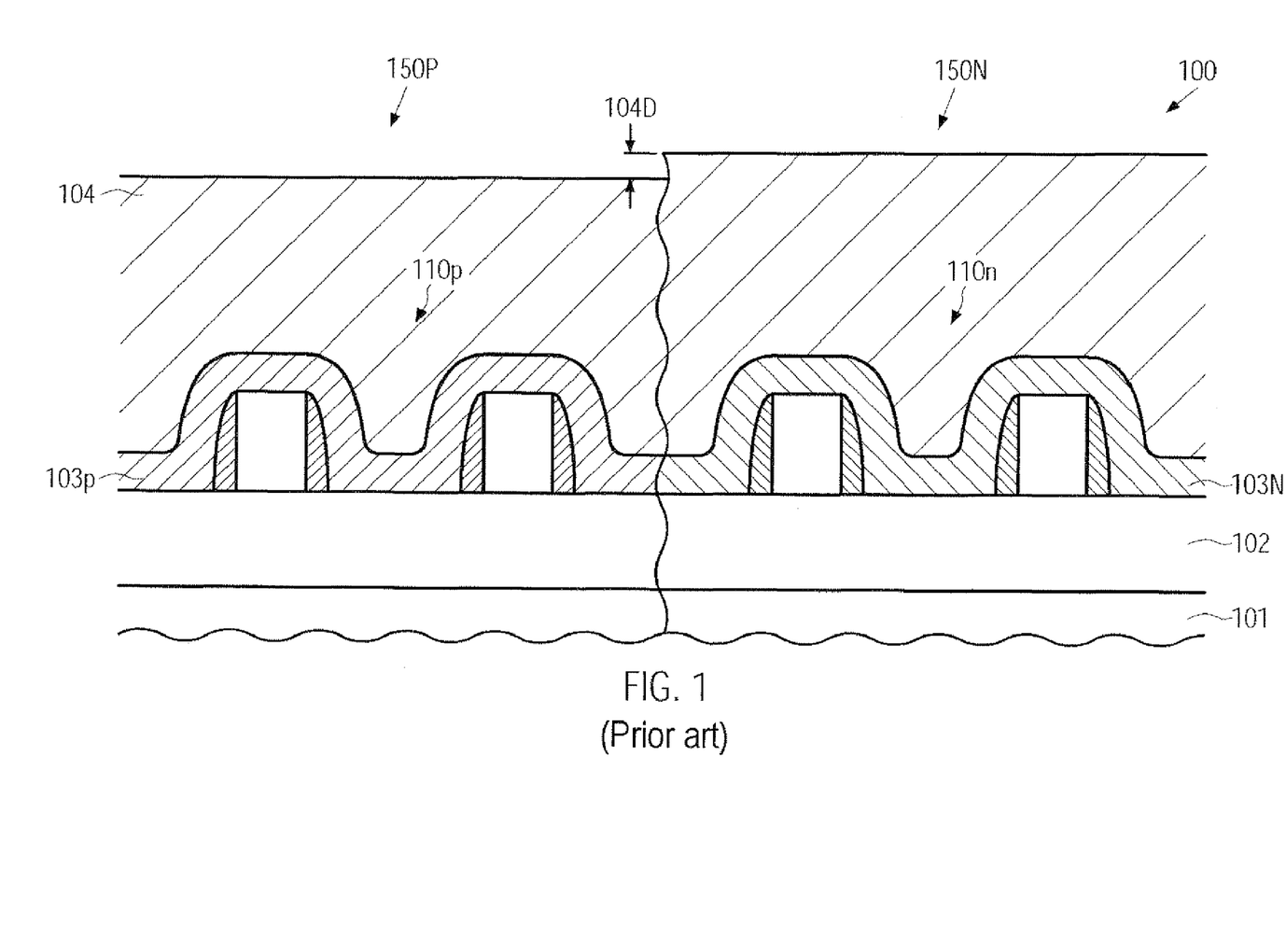
FIG. 1 schematically illustrates a cross-sectional view of a conventional semiconductor device including different device regions having formed therein highly stressed dielectric materials of different internal stress and an interlayer dielectric material, according to conventional process strategy, thereby resulting in non-uniformities during the formation of contacts.

With reference to FIG. 1, the problems involved in forming an interlayer dielectric stack for advanced semiconductor devices will now be described in more detail. FIG. 1 schematically illustrates a semiconductor device 100 comprising a substrate 101 that may represent a bulk silicon substrate or a silicon-on-insulator (SOI) substrate having formed thereon a device layer or semiconductor layer 102. The semiconductor layer 102 may be a silicon-based material, whose mobility characteristics of the respective charge carriers may be adjusted on the basis of strain induced therein according to the principles described above. It should be appreciated that, for an SOI configuration, the substrate 101 may comprise a buried insulating layer (not shown) on which may be formed the semiconductor layer 102. The semiconductor device 100 comprises a first device region 150N, which may represent a portion of the semiconductor layer 102, in and above which are a plurality of circuit elements 110n, such as field effect transistors, that represent a specific type of conductivity. For instance, the transistor elements 110n may represent N-channel transistors formed on the semiconductor layer 102 having an appropriate crystalline orientation so as to enable an increase of charge carrier mobility by creating a specific strain in the first device region 150N. Similarly, a second device region 150P may comprise a plurality of circuit elements 110p, such as transistors, wherein a different type of strain in the relevant portion of the semiconductor layer 102 may provide enhanced charge carrier mobility for the circuit elements 110p, which may therefore represent P-channel transistors. In the manufacturing stage shown in FIG. 1, a highly stressed dielectric material 103N is formed in the first device region 150N, wherein the material 103N may be comprised of silicon nitride and the like, as previously explained, and may induce the desired type of strain in the underlying portion of the semiconductor layer 102. Similarly, a second stressed dielectric material 103p is provided in the second device region 150P, wherein the internal stress of the material 103p may provide a desired type of strain. For example, the material 103p may be comprised of silicon nitride, nitrogen-containing silicon carbide and the like. Moreover, the semiconductor device 100 comprises an interlayer dielectric material 104, such as silicon dioxide, to passivate and enclose the circuit elements 110n, 110p in the first and second device regions 150N, 150P.

A typical process flow for forming the semiconductor device 100 may comprise the following processes. After the formation of the circuit elements 110n, 110p on the basis of well-established CMOS techniques, which may include the provision of further stress-inducing sources, such as the incorporation of strained semiconductor alloys, the application of stress memorization techniques and the like, the stress-inducing layers 103N, 103p may be formed on the basis of an appropriate patterning regime, as described above. That is, one of the layers 103N, 103p may be deposited first and may be subsequently removed from one of the device regions 150N, 150P, followed by the deposition of the other one of the layers 103p, 103N, for instance, including the deposition of an appropriate etch stop material (not shown), followed by a selective removal of a non-desired portion of the stress-inducing layer. Thereafter, the interlayer dielectric material 104 may be deposited on the basis of SACVD techniques, as previously discussed, and, thereafter, depending on the process strategy, a PECVD material may be deposited. In any case, a subsequent planarization process may be performed to enhance the surface topography of the device 100, wherein, however, a difference in height between the first and second device regions 150N, 150P may be observed, in particular in semiconductor devices corresponding to the 65 nm technology and beyond. For example, a difference in the thickness of the interlayer dielectric material 104 and thus a difference in height, indicated as 104D, may be observed between the first and second device regions 150N, 150P which may even remain after the planarization process. Consequently, during the subsequent lithography process and a complex contact etch process for forming respective contact openings, different process conditions may be encountered in the first and second device regions 150N, 150P, thereby resulting in non-uniformities of the contact openings and the finally obtained contacts after refilling the openings with a conductive material. Thus, the non-uniformity of the resulting contacts may lead to reduced production yield due to increased probability for contact failures of the device 100.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to process techniques in which enhanced gap filling capabilities during the formation of an interlayer dielectric material may be maintained by using a sub-atmospheric deposition technique, while, on the other hand, negative influences, such as different deposition characteristics in different device areas comprising highly stressed dielectric materials with different internal stress, may be compensated for or the effects of these different deposition characteristics may at least be reduced. To this end, a buffer material may be selectively provided above a dielectric material of one type of internal stress prior to the deposition of the interlayer dielectric material, thereby providing a certain "height offset" to compensate for or reduce a difference in deposition rate of the interlayer dielectric material. The selective formation of the buffer material may be readily implemented in well-established process strategies for forming differently stressed contact etch stop layers, thereby enabling application of these techniques to aggressively scaled semiconductor devices for the 65 nm technology, the 45 nm technology and even beyond.

One illustrative method disclosed herein comprises forming a first stress-inducing dielectric material above first and second device regions of a semiconductor device, wherein a first device region comprises one or more first transistors and the second device region comprises one or more second transistors. The method further comprises selectively removing a portion of the first stress-inducing dielectric material from above the second device region and forming a second stress-inducing dielectric material above the first and second device regions. Furthermore, a buffer material is formed above the second stress-inducing material above the first and second device regions and a portion of the buffer material and a portion of the second stress-inducing material are selectively removed from above the first device region. Finally, an interlayer dielectric material is formed above the first and second device regions.

Another illustrative method disclosed herein comprises forming a compressive stress-inducing layer above first and second device regions of a semiconductor device, wherein the first device region comprises one or more first transistors and the second device region comprises one or more second transistors. Additionally, the method comprises forming a buffer material above the compressive stress-inducing layer and selectively removing a portion of the buffer material and a portion of the compressive stress-inducing layer from above the first device region. The method further comprises forming a tensile stress-inducing layer above the first and second device regions and selectively removing a portion of the tensile stress-inducing layer from above the second device region by using the buffer material as an etch stop material. Finally, an interlayer dielectric material is formed above the first and second device regions while using the buffer material as a height leveling material for reducing a height difference between the first and second device regions.

Still another illustrative method disclosed herein comprises determining a difference of deposition heights for an interlayer dielectric material when formed above a compressive stress-inducing material and a tensile stress-inducing material. The method additionally comprises selecting a target thickness for a buffer material on the basis of the determined difference. Finally, the method comprises using the target thickness for forming one or more semiconductor devices by forming a tensile stress-inducing layer above a first device region, forming a compressive stress-inducing layer above a second device region, selectively forming the buffer material above the compressive stress-inducing layer and forming the interlayer dielectric material above the first and second device regions.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein addresses the problem of process non-uniformities during the formation of contact openings and contacts formed in an interlayer dielectric material that is deposited on stress-inducing materials of different internal stress levels. Without intending to restrict the application with the following explanation, it is believed that the deposition of a silicon dioxide based interlayer dielectric material on the basis of sophisticated SACVD techniques may result in different deposition rates above compressively stressed material and tensilely stressed material. The difference in deposition rate may thus result in a difference of the resulting height, even after respective planarization steps, such as CMP processes, since this additional contribution created by the differing deposition rate to overall surface topography may not be efficiently reduced during the planarization process. For this reason, the principles disclosed herein provide manufacturing techniques in which a buffer material may be selectively provided that comprise similar etch characteristics during an etch process for forming contact openings while also selectively providing a certain amount of "extra height" prior to the actual deposition of the interlayer dielectric material, thereby resulting in an overall enhanced surface topography after the planarization process. In some illustrative embodiments, the techniques disclosed herein may be based on the finding that a difference in height of the interlayer dielectric material may be compensated for by determining an appropriate target value for the buffer material, which may then be appropriately integrated in well-established manufacturing sequences so as to "balance" the difference in deposition rate for the interlayer dielectric material. Thus, after obtaining statistically relevant measurement data with respect to different height levels of the interlayer dielectric material under consideration with respect to the underlying highly stressed materials, a robust process sequence may be established while still maintaining the advantages achieved by the provision of highly stressed material of different internal stress and the desirable deposition behavior of SACVD techniques even for highly advanced semiconductor devices. In other illustrative embodiments, the selective provision of a buffer material may be efficiently combined with well-established process strategies to obtain enhanced process uniformity while substantially not adding to overall process complexity. For example, in some illustrative aspects, the process for providing a buffer material may be performed in situ with the process of depositing a highly stressed dielectric material, thereby obtaining low cycle times and reducing the probability of increasing defect rate. In this context, an in situ process is to be understood as a process in which two different process steps, such as the deposition of a highly stressed dielectric material and the deposition of a buffer material, are performed in the same process chamber. In even further illustrative embodiments disclosed herein, the selective provision of the buffer material may be implemented in a highly efficient manner by concurrently using the buffer material as an etch stop material during the patterning of the highly stressed dielectric materials. Consequently, well-established process techniques for forming differently stressed contact etch stop materials may be maintained while providing the prospect of applying these techniques to further scaled semiconductor devices.

Figure 2A:
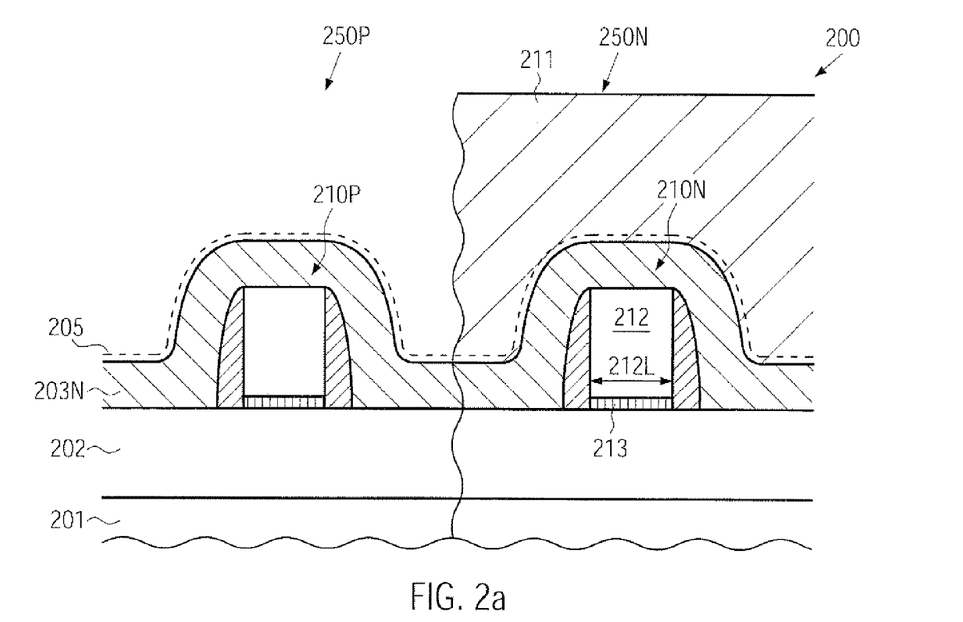
FIGS. 2*a*-2*h* schematically illustrate cross-sectional views of a semiconductor device during various manufacturing stages in forming an interlayer dielectric material with reduced height non-uniformities on the basis of a selectively provided buffer material according to illustrative embodiments.

FIG. 2a schematically illustrates a semiconductor device 200 which may comprise a substrate 201 that may be provided in the form of any appropriate material, such as a semiconductor material, an insulating material and the like. Above the substrate 201 may be provided a semiconductor layer 202, which may be comprised of any appropriate semiconductor material for forming therein and thereabove circuit features, such as field effect transistors and the like. The semiconductor layer 202 may thus comprise any appropriate component which may enable a significant modification of charge carrier mobility therein on the basis of a certain degree of strain level. In some illustrative embodiments, the semiconductor layer 202 may represent semiconductor material comprising silicon, which may also include, locally or globally, other semiconductor materials, in addition to appropriately positioned dopants. For example, the semiconductor layer 202, when comprising silicon, may also comprise other semiconductor materials, such as silicon/germanium alloys, germanium regions, silicon/carbon alloys, silicon/germanium/tin alloys and the like, so as to adapt band gap characteristics and charge carrier mobility in any appropriate manner. The semiconductor layer 202 may be formed on an appropriately selected crystalline material, such as a silicon material or any other semiconductor material, while, in other cases, the semiconductor layer 202 may be formed, at least in certain device areas, on a buried insulating layer (not shown), thereby providing an SOI configuration. Furthermore, it should be noted that the semiconductor layer 202 may typically be provided in the form of a substantially crystalline semiconductor material, wherein the crystallographic characteristics, in terms of crystal orientation, may be different in different device regions of the semiconductor device 200.

The semiconductor device 200 may further comprise a first device region 250N, which may comprise one or more circuit elements 210N, such as field effect transistors and the like. Furthermore, the device 200 may comprise a second device region 250P, which may also include one or more circuit elements 210P, such as field effect transistors, as also explained above when referring to the semiconductor device 100. In one illustrative embodiment, the first device region 250N may correspond to a portion of the device 200 in which a high tensile strain is to be induced in the relevant portion of the semiconductor layer 202 to enhance performance of the circuit element 210N, when representing an N-channel field effect transistor. On the other hand, the second device region 250P may represent a region in which a high compressive strain is to be introduced in the relevant portion of the layer 202 to enhance performance of the circuit element 210P when representing a P-channel field effect transistor. For example, the devices 210N, 210P when representing field effect transistors may include a gate electrode structure 212 including a gate insulation layer 213 and having a gate length 212L, i.e., in FIG. 2a, the horizontal dimension of the structure 212, of approximately 50 nm and less, for instance, 40 nm and less, for devices corresponding to the 65 nm technology node.

In this manufacturing stage, the semiconductor device 200 may further comprise a first stress-inducing layer 203N, i.e., the layer 203N may represent a dielectric material having a high internal stress selected so as to induce the desired type of strain in the portion of the semiconductor layer 202 corresponding to the first device region 250N. For example, the first stress-inducing layer 203N may represent a dielectric material of high internal tensile stress. For instance, the layer 203N may be provided in the form of a silicon nitride material. As previously explained, the semiconductor device 200 may comprise portions including closely spaced circuit elements, thereby possibly restricting the thickness of the layer 203N to values of approximately 10-100 nm. For convenience, any such closely spaced circuit elements are not shown in FIG. 2a. Furthermore, the device 200 may comprise an etch mask 211 covering the first device region 250N, while exposing the second device region 250P.

The semiconductor device 200 as shown in FIG. 2a may be formed on the basis of well-established process techniques, as are also described with reference to the semiconductor device 100. Thus, the circuit elements 210N, 210P may be formed on the basis of any process strategies required by design rules and process strategy, where highly sophisticated techniques may be used, for instance, the provision of high-k dielectric materials in the gate insulation layer 213, the incorporation of any strain-inducing concepts, such as the provision of strained or relaxed semiconductor alloys and the like, stress memorization techniques and the like. After having formed the circuit elements 210N, 210P, the first stress-inducing layer 203N may be formed on the basis of PECVD techniques while controlling the deposition parameters such that the desired high internal stress may be created. It should be appreciated that, in some illustrative embodiments, prior to the deposition of the layer 203N, an appropriate etch stop layer (not shown) may be formed to enhance the etch selectivity in the first device region 250P during a subsequent patterning process. In other cases, a corresponding etch stop layer may be omitted, as shown, when the selectivity of the semiconductor layer 202 and any materials formed thereon with respect to the material of the layer 203N is considered appropriate. In still other illustrative embodiments, an etch stop layer or etch indicator layer 205 may be optionally formed on the first stress-inducing layer 203N, as indicated by the dashed line, to enhance the further processing of the device 200. For example, the optional etch stop layer or etch indicator layer 205 may be formed of a different material compared to the material of a further stress-inducing layer to be formed in a subsequent manufacturing stage, thereby enabling the optional layer 205 to be used as a layer for controlling a corresponding patterning process. The optional layer 205 may be formed by deposition, surface treatment of the layer 203N and the like. Next, the etch mask 211, for instance in the form of a resist mask, may be provided on the basis of well-established photolithography techniques. Thereafter, a selective etch process may be performed to remove the exposed portion of the first stress-inducing layer 203N and of the layer 205, if provided, wherein the corresponding etch process may be controlled on the basis of an additional etch stop layer, as previously explained, while, in other cases, the material formed on top of the semiconductor layer 202 may provide sufficient etch stop capabilities.

Figure 2B:
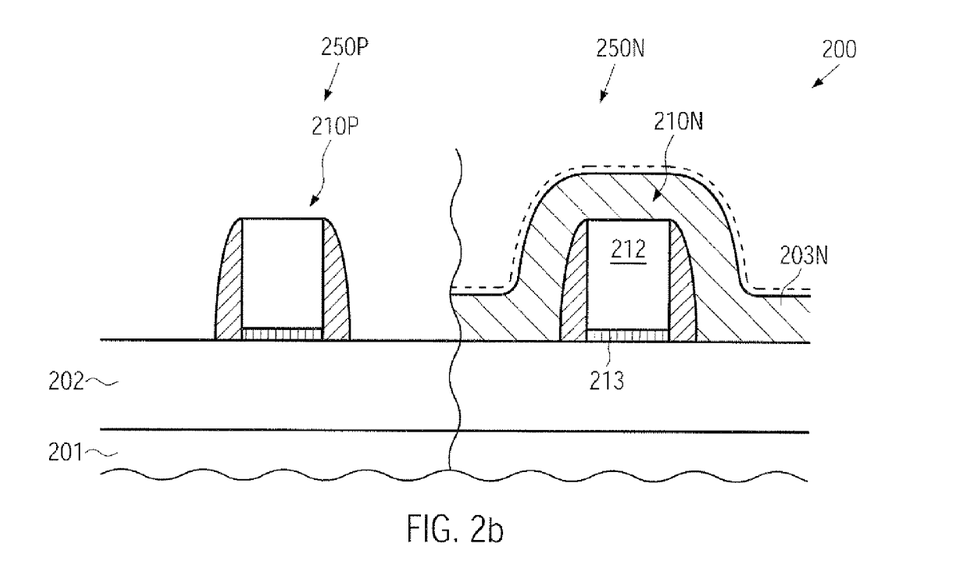

FIG. 2b schematically illustrates the semiconductor device 200 in an advanced manufacturing stage after the above-described process sequence and after the removal of the etch mask 211. Thus, the first stress-inducing layer 203N is now selectively provided in the first device region 250N, thereby creating the desired type of strain therein.

Figure 2C:
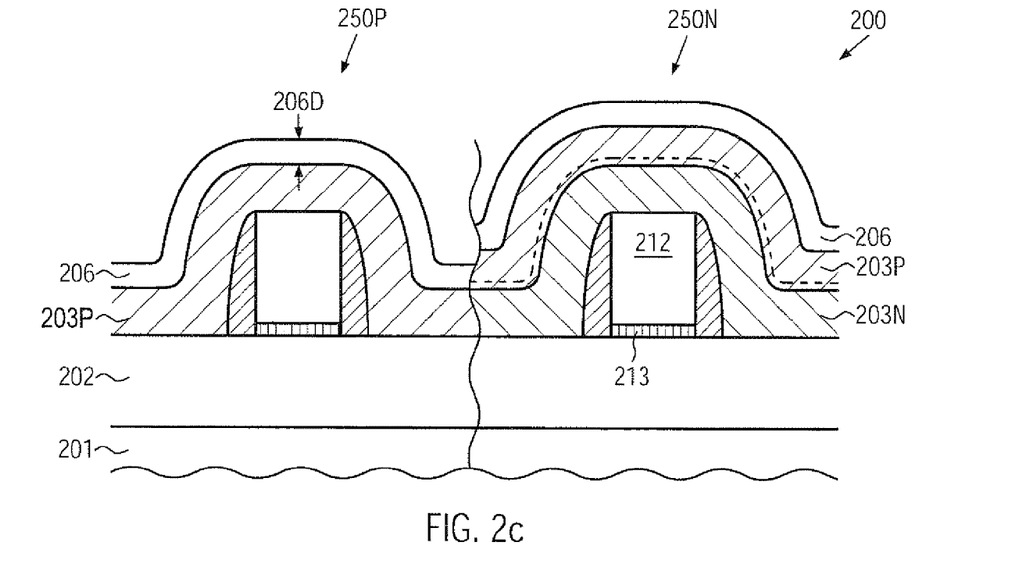

FIG. 2c schematically illustrates the semiconductor device 200 in a further advanced manufacturing stage, in which a second stress-inducing layer 203P may be formed above the first and second circuit elements 210P, 210N, wherein the layer 203P is designed so as to have a high internal stress for enhancing the charge carrier mobility in the second device region 250P, as previously explained. For instance, the layer 203P may be provided with high internal compressive stress when the circuit element 210P represents a P-channel transistor. Furthermore a buffer layer 206 is formed above the first and second device regions 250P, 250N, wherein, in one illustrative embodiment, the buffer layer 206 may be formed directly on the second stress-inducing layer 203P. The buffer layer 206 may have a different material composition compared to the layer 203P, wherein the etch characteristics of the layer 206 and thus the material composition thereof may be selected so that it provides a similar etch behavior during an etch process for forming contact openings in an interlayer dielectric material still to be formed. In one illustrative embodiment, the buffer layer 206 may comprise a silicon dioxide based material, thereby providing similar etch characteristics compared to a silicon dioxide based interlayer dielectric material. In some illustrative embodiments, the buffer material may be formed so as to exhibit, in addition to similar etch characteristics, a high internal stress level in order to further enhance the efficiency of the layer 203P in the second device region. For instance, the silicon dioxide may be formed with high internal compressive stress on the basis of PECVD techniques. A thickness of a buffer layer 206D may be selected so as to obtain a desired height leveling effect of the buffer layer 206 with respect to the deposition of an interlayer dielectric material still to be formed. In some illustrative embodiments, the height difference, as for instance illustrated in FIG. 1 in the form of the difference 104D, may be determined for a plurality of devices, for instance, by performing respective experiments and/or by evaluating actual semiconductor devices formed in accordance with conventional strategies, such as the device 100, in order to obtain statistically relevant measurement data with respect to a difference of the deposition characteristics of an interlayer dielectric material with respect to highly stressed dielectric materials of different internal stress levels. For example, the height difference 104D may be determined for a specific internal stress level and thickness for the layers 203N, 203P, and for a specified deposition recipe of the interlayer dielectric material and a target thickness thereof. Based on respective measurement data representing the difference 104D, an appropriate target value may be selected so as to obtain a desired thickness 206D for the buffer layer 206. For instance, the thickness 206D may range from approximately 15-50 nm for semiconductor devices having critical dimensions of 40 nm and less.

The semiconductor device 200 as shown in FIG. 2C may be formed on the basis of the following processes. The layer 203P may be deposited by well-established PECVD techniques while appropriately adjusting the process parameters for obtaining a desired internal stress level, such as a high compressive stress. For instance, silicone nitride, nitrogen-containing silicon carbide and the like may be formed with high internal compressive stress. It should be appreciated that the layers 203N, 203P may be provided with similar layer thickness so as to provide highly uniform process conditions during the further manufacturing sequence. In other illustrative embodiments, the layers 203N, 203P may be provided with different thickness, wherein appropriate materials of substantially the same composition, such as silicon nitride, may be subsequently provided to obtain similar thickness levels in the first and second device regions 250N, 250P. After the deposition of the layer 203P, in one illustrative embodiment, the buffer layer 206 may immediately be deposited on the layer 203P, which may be accomplished in one illustrative example by an in situ process using the same process chamber as has been used for the deposition of the layer 203P. For instance, the layer 203P, when comprised of silicon nitride or nitrogen-containing silicon carbide, may be formed on the basis of silane as a precursor material, while this precursor material may also be used for the deposition of the buffer layer 206 in order to form a silicon dioxide based material. Thus, in this case, the additional formation of the buffer layer 206 may not significantly contribute to an increased overall cycle time. In other cases, the buffer layer 206 may be formed on the basis of any other appropriate deposition recipe using a dedicated deposition tool.

Figure 2D:
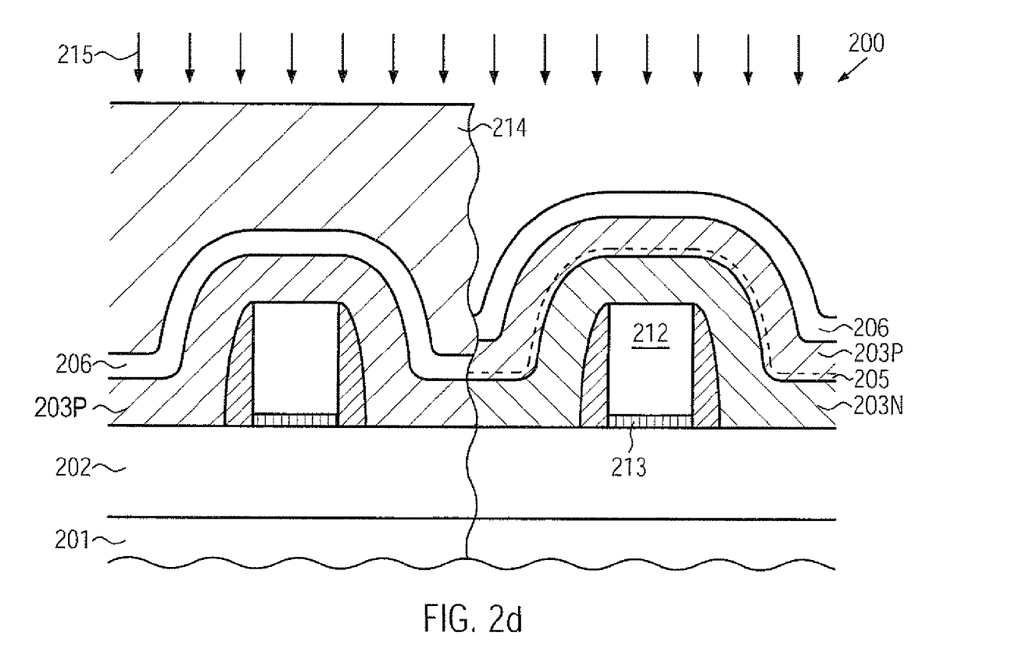

FIG. 2d schematically illustrates the semiconductor device 200 with an etch mask 214 covering the second device region 250P while exposing the first device region 250N to an etch process 215. The etch process 215 may comprise a first etch step for removing the buffer material 206 from above the first device region 250N, wherein the layer 203P may act as an etch stop material. Thereafter the process 215 may be continued on the basis of an appropriate etch chemistry for etching the exposed material of the layer 203P, wherein the corresponding etch step may be controlled on the basis of the etch stop or etch indicator layer 205, if provided, or this etch step may be controlled on the basis of other control schemes, such as controlling the etch time and the like. In still other illustrative embodiments, the etch process 215 may be designed as a non-selective etch process so as to etch through the buffer material 206 and the material of the layer 203P, wherein similar control strategies may be used in order to avoid undue removal of material of the layer 203N. For example, non-selective etch recipes as well as selective recipes with respect to silicon dioxide and silicon nitride materials are well established in the art and may be used for the etch process 215.

After the removal of the exposed portion of the buffer material 206 and the exposed portion of the layer 203P, the further processing may be continued on the basis of an appropriate deposition process for forming an interlayer dielectric material, such as silicon dioxide on the basis of an SACVD technique, as also previously described with reference to the device 100. The deposition of an appropriate interlayer dielectric material may also include the deposition of a cover layer, as previously indicated, when respective material characteristics of the SACVD oxide may be considered inappropriate at an upper portion of the interlayer dielectric material. In this case, for example, silicon dioxide formed on the basis of PECVD may be deposited, if desired. Thereafter, any appropriate planarization techniques may be used, such as CMP, etching by using a highly non-conformal deposited sacrificial material and the like.

Figure 2E:
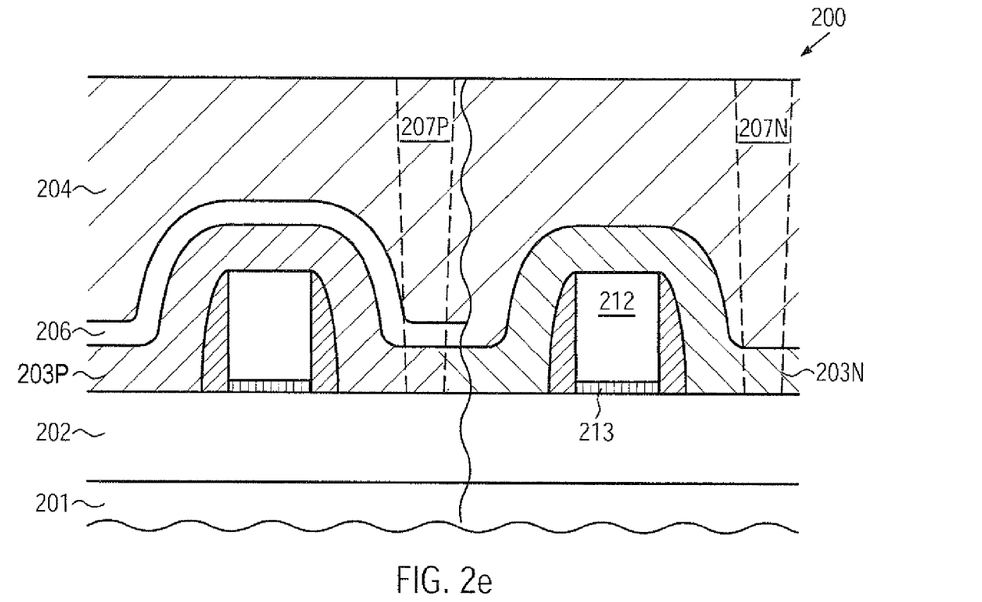

FIG. 2e schematically illustrates the semiconductor device 200 with an interlayer dielectric material 204, at least a significant portion of which may be formed on the basis of an SACVD technique to provide a silicon dioxide based material with enhanced gap fill capabilities as explained above. Due to the selective provision of the buffer layer 206, a reduced deposition rate above the second device region 250P may be compensated for, or at least the effect thereof may be reduced, thereby obtaining a height level for the first and second device regions 250N, 250P, which may be similar or substantially equal, depending on the initial thickness 206D. Moreover, the material characteristics of the buffer material 206 may be similar to the material 204, at least with respect to an etch process to be performed to provide contact openings 207P, indicated as dashed lines, in the interlayer dielectric material 204, the buffer material 206 and the material 203P in a later manufacturing stage. Consequently, the contact openings 207P may be formed under very similar conditions compared to contact openings 207N to be formed in the first device region, thereby reducing any process non-uniformities during formation of respective contacts and thus enhancing performance and reliability of the semiconductor device 200.

Figure 2F:
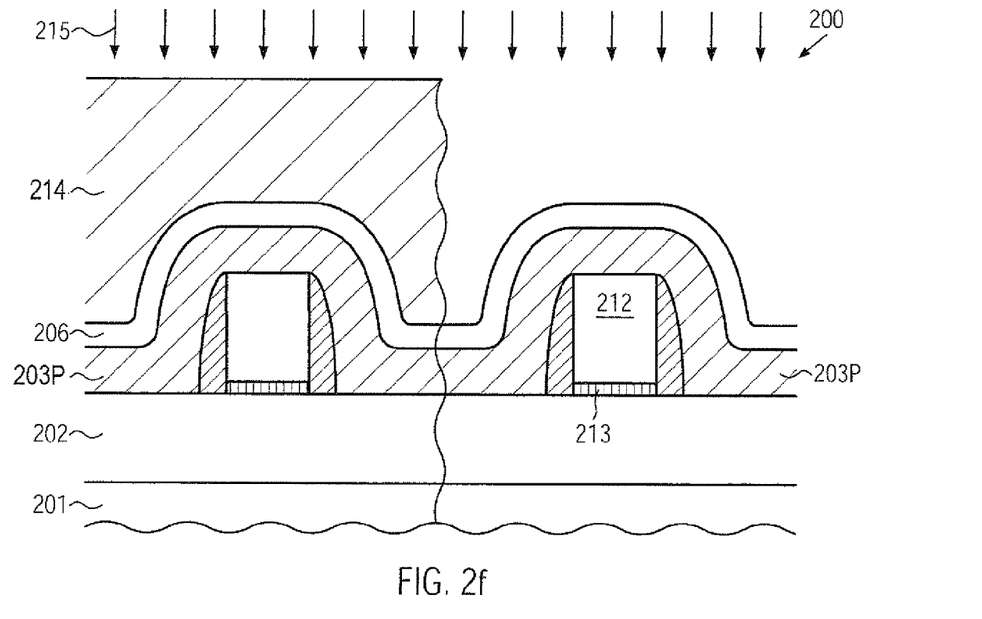
Figure 2G:
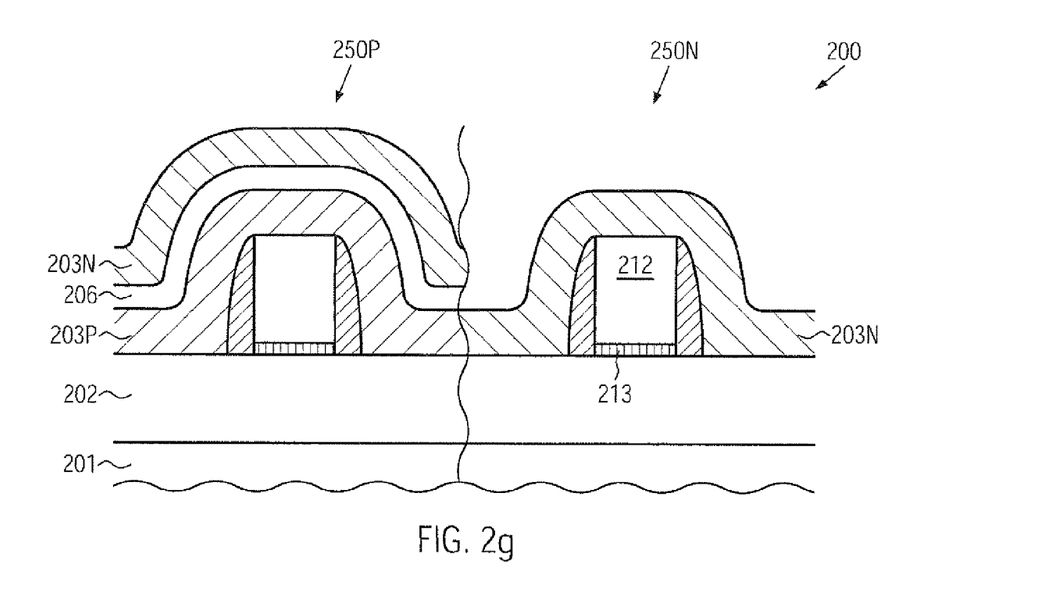
Figure 2H:
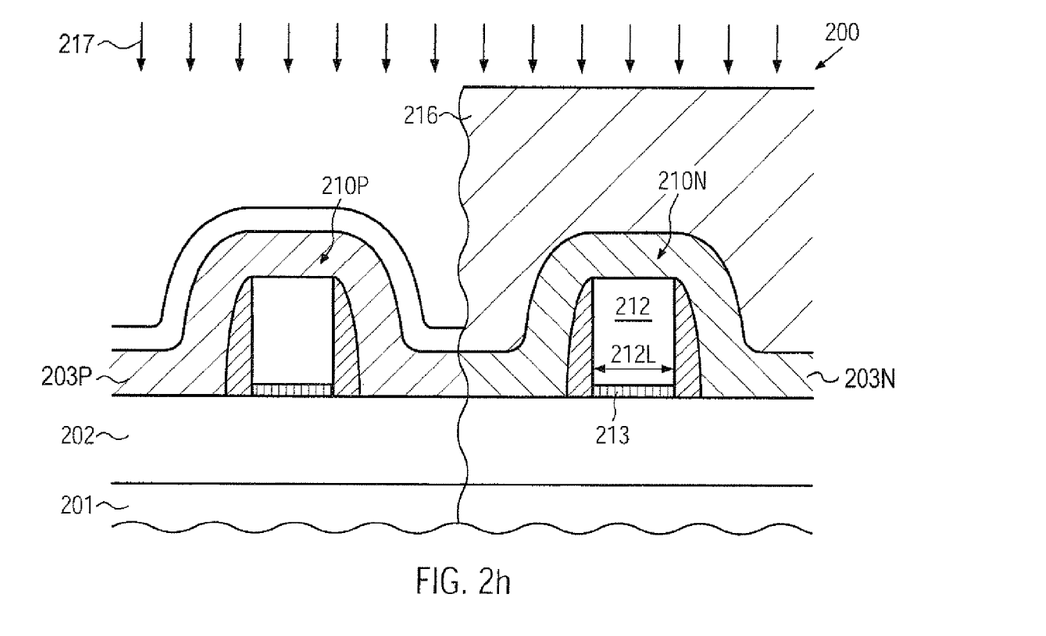

With reference to FIGS. 2f-2h, further illustrative embodiments will now be described in which the buffer material 206 may be formed prior to the deposition of the final portion of a stressed dielectric material.

FIG. 2f schematically illustrates the semiconductor device 200 in a manufacturing stage in which the stress-inducing layer 203P is formed first above the first and second device regions 250N, 250P, followed by the deposition of the buffer material 206. With respect to any process techniques for the materials 203P and the buffer material 206, it may be referred to the previously described embodiments. Furthermore, as previously indicated, prior to the deposition of the material 203P, an appropriate etch stop material may be provided if the selectivity of the material formed in the layer 202 in the first device region 250N may be considered inappropriate during the etch process 215 for removing portions of the materials 206 and 203P exposed by the etch mask 214. In other cases, as shown, the etch process 215 may be performed without a corresponding etch stop layer. With respect to the characteristics of the etch process 215, the same criteria apply as described above with reference to FIG. 2d.

FIG. 2g schematically illustrates the semiconductor device 200 in a further advanced manufacturing stage after the completion of the etch process 215 and after the removal of the etch mask 214. Furthermore, the stress-inducing layer 203N may be formed above the first and second device regions 250N, 250P, wherein the same criteria may apply in terms of material characteristics of the layer 203N and process techniques for forming the same, as previously explained.

FIG. 2h schematically illustrates the semiconductor device 200 during a further etch process 217 that is performed on the basis of an etch mask 216, which exposes the second device region 250P. During the etch process 217, the buffer material 206 may act as an efficient etch stop material, thereby enabling a reliable removal of any material residuals of the layer 203N, thereby further enhancing the process uniformity during the subsequent deposition of an interlayer dielectric material. For example, highly selective etch recipes are available for silicon nitride based material with respect to silicon dioxide, which may be advantageously used for the etch process 217. Consequently, undue removal of material of the buffer material 206 may be avoided. In other cases, a respective loss of material during the etch process 217 may be taken into consideration when selecting an appropriate target value for the initial thickness of the buffer material 206.

After the etch process 217, the etch mask 216 may be removed and the further processing may be continued as is also described above. That is, the interlayer dielectric material 204 may be provided, at least partially, on the basis of an SACVD technique, wherein the selectively provided buffer material 206 may reduce any process non-uniformities, as previously explained.

As a result, the embodiments disclosed provide an improved manufacturing technique for determining an appropriate thickness of a buffer material that is selectively provided in a device region suffering from a reduced deposition rate during the formation of an interlayer dielectric material, such as SACVD silicon dioxide. The selective provision of the buffer material may be effectively incorporated into any type of process sequence for forming highly stressed dielectric material of different internal stress levels without unduly contributing to overall process complexity. In some illustrative embodiments, a dielectric material of high tensile stress may be formed first and may be patterned, followed by the deposition of a dielectric material of high compressive internal stress. Subsequently, the buffer material may be formed and may be patterned together with the dielectric material of high compressive stress. In other illustrative strategies, the compressively stressed material may be provided first, followed by the buffer material, having an appropriate thickness so as to act as an efficient etch stop layer during the subsequent patterning of a tensilely stressed material, while also providing the desired height leveling effect during the subsequent deposition of the interlayer dielectric material. The selective provision of the buffer material may, however, be incorporated in any process sequence, in which dielectric materials of different internal stress are provided above different device regions, as long as the desired height leveling effect and the compatibility with the etch characteristics of the overlying interlayer dielectric material is achieved. Moreover, appropriate target values for the thickness of the buffer material may be obtained in advance by investigating the deposition behavior for a plurality of different process conditions. In some illustrative embodiments, the target value for the buffer material may be controlled by a control strategy using the measurement data of previously processed substrates, wherein, for instance, advanced process control (APC) techniques may be used to control the deposition of the buffer material on the basis of the measured height difference or other parameters that indicate the difference on the deposition behavior of the SACVD process. Thus, enhanced process uniformity may be achieved even for highly scaled semiconductor devices including transistor elements having a gate length of approximately 40 nm and less.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first stress-inducing dielectric material above first and second device regions of a semiconductor device, said first device region comprising one or more first transistors and said second device region comprising one or more second transistors, respectively;
    selectively removing a portion of said first stress-inducing dielectric material from above said second device region;
    forming a second stress-inducing dielectric material above said first and second device regions;
    determining a difference of a deposition rate of an interlayer dielectric material when deposited on said first and second stress-inducing materials, said determined difference having a value other than zero;
    selecting a thickness of a buffer material on the basis of said determined difference;
    forming said buffer material having said selected thickness above said second stress-inducing material above said first and second device regions;
    selectively removing a portion of said buffer material and a portion of said second stress-inducing material from above said first device region; and
    forming an interlayer dielectric material above said first and second device regions.

2. The method of claim 1, wherein said buffer material is comprised of a material having a similar etch behavior compared to said interlayer dielectric material during an etch process for forming contact openings through said interlayer dielectric material, said buffer material and said first and second stress-inducing layers.

3. The method of claim 2, wherein said buffer material and said interlayer dielectric material are formed on the basis of silicon dioxide.

4. The method of claim 1, wherein a thickness of said buffer material is approximately 15 nm or higher.

5. The method of claim 1, wherein said second stress-inducing layer and said buffer material are formed by an in situ plasma assisted deposition process.

6. The method of claim 1, wherein said buffer material is deposited as a silicon dioxide based material using silane as a precursor material.

7. The method of claim 1, wherein said interlayer dielectric material is formed by performing a sub-atmospheric chemical vapor deposition process using a silicon-containing precursor material.

8. The method of claim 1, wherein said first stress-inducing layer is formed with a first type of internal stress, said first type of internal stress inducing a tensile strain in said first device region.

9. The method of claim 8, wherein said second stress-inducing layer is formed with a second type of internal stress, said second type of internal stress inducing a compressive strain in said second device region.

10. The method of claim 1, further comprising forming said first and second transistors on the basis of a design dimension of a gate electrode of approximately 40 nm and less.

11. A method, comprising:
    determining a difference of deposition heights for an interlayer dielectric material when formed above a compressive stress-inducing material and a tensile stress-inducing material formed above one or more first substrates, said determined difference having a value other than zero;
    selecting a target thickness for a buffer material on the basis of said determined difference; and
    forming a tensile stress-inducing layer above a first device region of one or more second substrates other than said first substrates;
    forming a compressive stress-inducing layer above a second device region of said one or more second substrates;
    selectively forming said buffer material above said compressive stress-inducing layer, said buffer material being formed to said target thickness; and
    forming said interlayer dielectric material above said first and second device regions of said one or more second substrates.

12. The method of claim 11, wherein said compressive stress-inducing layer and said buffer material are formed in situ after forming said tensile stress-inducing layer.

13. The method of claim 1, wherein selectively removing said portions of said buffer material and said second stress-inducing material from above said first device region comprises forming an etch stop layer on said first stress-inducing dielectric layer prior to forming said second stress-inducing material, forming a patterned mask layer above said semiconductor device, said patterned mask layer covering said second device region and exposing said first device region, and performing an etching process based on said etch stop layer.

14. A method, comprising:
   forming a first stress-inducing dielectric material above first and second device regions of a semiconductor device, said first device region comprising one or more first transistors and said second device region comprising one or more second transistors, respectively;
   forming an etch indicator layer on said first stress-inducing dielectric material;
   selectively removing a portion of said etch indicator layer and a portion of said first stress-inducing dielectric material from above said second device region;
   forming a second stress-inducing dielectric material above said first and second device regions;
   forming a buffer material above said first and second device regions, wherein a thickness of said buffer material is based upon a difference of a deposition rate of an interlayer dielectric material when deposited on said first and second stress-inducing layers, said difference having a value other than zero;
   forming a patterned mask layer above said semiconductor device to expose said first device region;
   performing an etch process based on said etch indicator layer to remove a portion of said buffer material and a portion of said second stress-inducing material from above said first device region; and
   forming an interlayer dielectric material comprising silicon dioxide above said first and second device regions.

15. The method of claim 14, wherein forming said interlayer dielectric material comprises:
   forming a first portion of said interlayer dielectric material using a sub-atmospheric chemical vapor deposition process; and
   forming a second portion of said interlayer dielectric material above said first portion using a plasma enhanced chemical vapor deposition process.

16. The method of claim 14, wherein said first stress-inducing layer is formed with a first type of internal stress and said second stress-inducing layer is formed with a second type of internal stress, said first type of internal stress inducing a tensile strain in said first device region and said second type of internal stress inducing a compressive strain in said second device region.

17. The method of claim 14, further comprising forming at least one contact via in said interlayer dielectric material, said at least one contact via contacting an active area of at least one of said first and second transistors.

* * * * *